United States Patent
Chin et al.

(10) Patent No.: US 8,907,735 B2
(45) Date of Patent: Dec. 9, 2014

(54) PULSE WIDTH MODULATION CIRCUIT AND PULSE WIDTH MODULATION SIGNAL GENERATING METHOD HAVING TWO REFRESH RATES

(71) Applicant: Silicon Touch Technology, Inc., Hsin-Chu (TW)

(72) Inventors: Chi-Yuan Chin, Taipei (TW); Kuei-Jyun Chen, Taoyuan County (TW)

(73) Assignee: Silicon Touch Technology Inc., Science-Based Industrial Park, Hsin-Chu (TW)

( * ) Notice: Subject to any disclaimer, the term of this patent is extended or adjusted under 35 U.S.C. 154(b) by 4 days.

(21) Appl. No.: 13/729,029

(22) Filed: Dec. 28, 2012

(65) Prior Publication Data

US 2013/0307634 A1    Nov. 21, 2013

(30) Foreign Application Priority Data

May 16, 2012 (TW) .............................. 101117350 A

(51) Int. Cl.
*H03K 3/017* (2006.01)
*H03K 7/08* (2006.01)
*H05B 37/02* (2006.01)

(52) U.S. Cl.
CPC . *H03K 3/017* (2013.01); *H03K 7/08* (2013.01)
USPC ............. 332/109; 315/158; 327/172; 345/12; 345/213; 375/238

(58) Field of Classification Search
USPC ........... 315/158; 327/172–177; 332/109–111; 345/102, 211–213, 690; 375/238
See application file for complete search history.

(56) References Cited

U.S. PATENT DOCUMENTS

| | | | | |
|---|---|---|---|---|
| 6,069,597 A | * | 5/2000 | Hansen | 345/74.1 |
| 6,841,947 B2 | * | 1/2005 | Berg-johansen | 315/169.3 |
| 7,233,309 B2 | * | 6/2007 | Diefenbaugh et al. | 345/102 |
| 7,292,221 B2 | * | 11/2007 | Woo | 345/102 |
| 7,352,339 B2 | * | 4/2008 | Morgan et al. | 345/31 |

(Continued)

FOREIGN PATENT DOCUMENTS

| | | |
|---|---|---|
| EP | 2 048 648 A2 | 4/2009 |
| EP | 2 048 648 A3 | 9/2009 |
| JP | H02165721 A | 6/1990 |
| JP | H03148911 A | 6/1991 |

OTHER PUBLICATIONS

Won-Sik Oh et al., "A Novel Two-Dimensional Adaptive Dimming Technique of X-Y Channel Drivers for LED Backlight System in LCD TVs", Jan. 1, 2009, pp. 20-26, Journal of Display Technology, vol. 5, No. 1, XP011252823, IEEE.

*Primary Examiner* — Levi Gannon
(74) *Attorney, Agent, or Firm* — Winston Hsu; Scott Margo

(57) ABSTRACT

A PWM circuit that can have two refresh rates, including: a first PWM signal generator and a second PWM signal generator; wherein the first PWM signal generator and the second PWM signal generator respectively control refresh rates in two dimensions of an output data generated from a target apparatus. A PWM signal generation method that can have two refresh rates, including: generating a first PWM signal; generating a second PWM signal; and controlling refresh rates in different dimensions of an output data generated from a target apparatus respectively by using the first PWM signal and the second PWM signal.

16 Claims, 7 Drawing Sheets

(56) References Cited

U.S. PATENT DOCUMENTS

| | | | |
|---|---|---|---|
| 8,174,302 B2* | 5/2012 | Fujiwara | 327/291 |
| 8,193,734 B2* | 6/2012 | Chen et al. | 315/294 |
| 2006/0044291 A1* | 3/2006 | Willis | 345/204 |
| 2007/0212078 A1 | 9/2007 | Jo | |
| 2010/0053223 A1* | 3/2010 | Otsuka et al. | 345/690 |
| 2010/0091048 A1* | 4/2010 | Aitken et al. | 345/690 |
| 2011/0074301 A1* | 3/2011 | Goder | 315/210 |
| 2011/0241560 A1* | 10/2011 | Englert | 315/287 |
| 2012/0049760 A1* | 3/2012 | Dennis et al. | 315/294 |

\* cited by examiner

PULSE WIDTH MODULATION CIRCUIT AND PULSE WIDTH MODULATION SIGNAL GENERATING METHOD HAVING TWO REFRESH RATES

BACKGROUND OF THE INVENTION

1. Field of the Invention

The disclosed embodiments of the present invention relate to a pulse width modulation (PWM) circuit and a PWM signal generation method, and more particularly, to a PWM circuit and a PWM signal generation method that can have two refresh rates.

2. Description of the Prior Art

In electronic apparatuses, a pulse width modulation (PWM) signal is usually utilized as a control signal. For example, the duty cycle of a PWM signal might be adjusted to control the brightness of video frames or the charging/discharging of a voltage conversion circuit.

FIG. 1 is a diagram illustrating a conventional PWM signal. PWM signals with different cycles are denoted by $PWM_a$ and $PWM_b$, respectively. As shown in FIG. 1, an example of a minimum pulse (1 ns) is illustrated, where $PWM_a$ is a PWM signal with a cycle of 256 ns, and $PWM_b$ is a PWM signal with a cycle of 512 ns. When the PWM signal is used to control the brightness of video frames, the cycle means the refresh rate. That is to say, a PWM signal with a short cycle has a higher refresh rate, and a PWM signal with a longer cycle has a lower refresh rate in contrary. In addition, a PWM signal has another important characteristic, the resolution. In the example of FIG. 1, the resolution of the $PWM_a$ is $1/256$, and the resolution of the $PWM_b$ is $1/512$. That is to say, $PWM_b$ could be a control signal with a precision higher than that of $PWM_a$. However, as described above, the refresh rate of $PWM_b$ is lower than $PWM_a$, and thus the resolution is inversely proportional to the refresh rate.

Generally speaking, only a single PWM signal of a single dimension (i.e., a single direction) is used in the current control mechanism of the PWM signal. Therefore, there would be a trade off between the resolution and the refresh rate, thus adding limitations to the circuit design.

SUMMARY OF THE INVENTION

Therefore, one objective of the present invention is to provide a PWM circuit that can have two refresh rates and a related PWM signal generation method thereof.

According to a first aspect of the present invention, a PWM circuit that can have two refresh rates is disclosed, including: a first PWM signal generator and a second PWM signal generator; wherein the first PWM signal generator and the second PWM signal generator respectively control refresh rates in different dimensions of output data from a target apparatus.

According to a second aspect of the present invention, a PWM circuit that can have two refresh rates is disclosed, wherein the PWM circuit is used by a target apparatus to generate an output data, and the output data comprises a plurality of data unit. The PWM circuit comprises: a first PWM signal generator and a second PWM signal generator; wherein the first PWM signal generator controls a first part of each of the data units, and the second PWM signal generator controls a second part of each of the data units, thus the output data can have two refresh rates.

According to a third aspect of the present invention, a PWM signal generation method that can have two refresh rates is disclosed, including: generating a first PWM signal; generating a second PWM signal; and controlling refresh rates in different dimensions of output data from a target apparatus respectively by using the first PWM signal and the second PWM signal.

According to a fourth aspect of the present invention, a PWM signal generation method that can have two refresh rates is disclosed, wherein the PWM signal generation method is used by a target apparatus to generate an output data, and the output data comprises a plurality of data unit, and the PWM signal generation method includes: generating a first PWM signal generator; generating a second PWM signal generator; and controlling a first part of each of the data units by the first PWM signal, and controlling a second part of each of the data units by using the second PWM signal, thus the output data can have two refresh rates.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
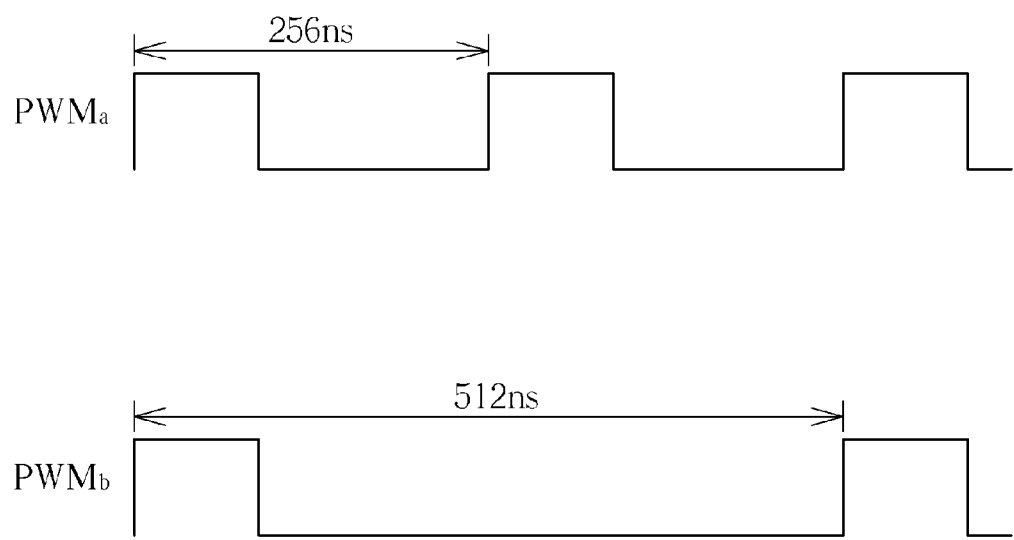
FIG. 1 is a diagram illustrating a conventional PWM signal.
Figure 2:
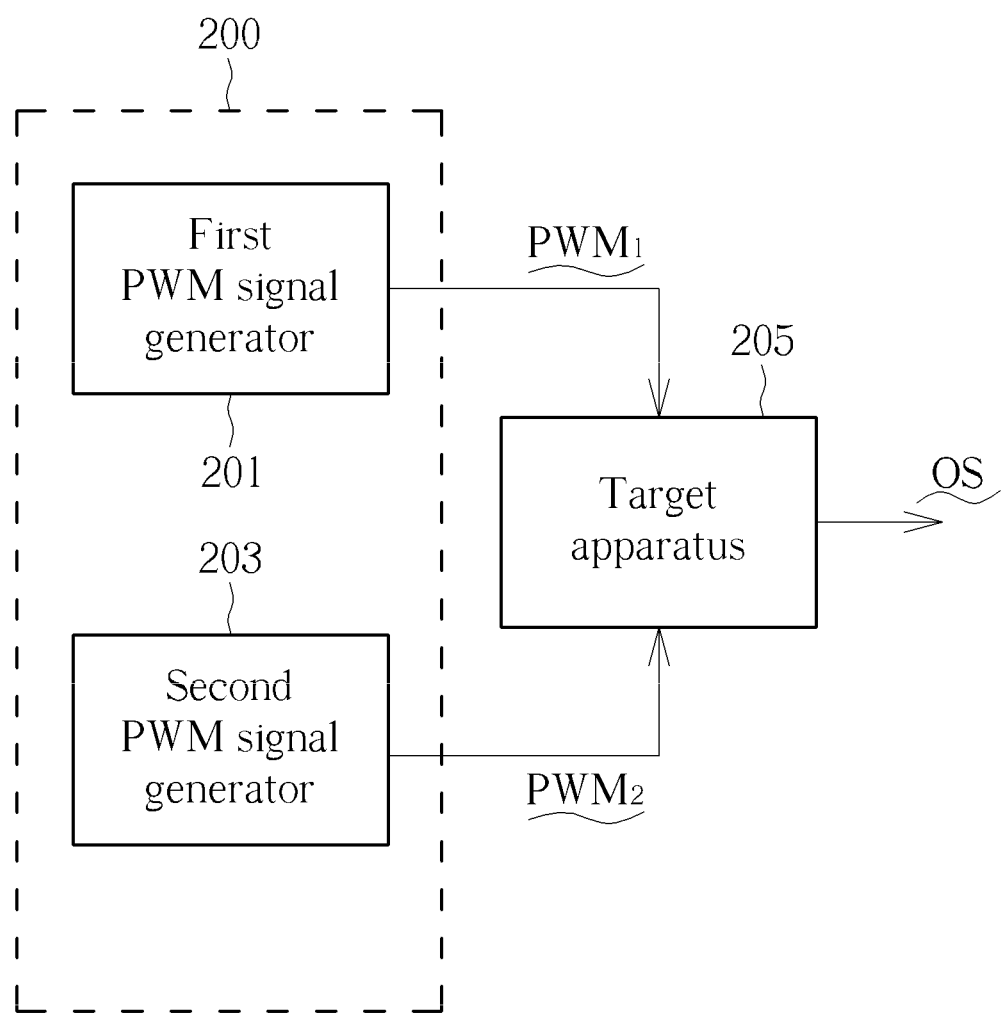
FIG. 2 is a block diagram illustrating a PWM circuit according to an embodiment of the present invention.

FIG. 2 is a block diagram illustrating a PWM circuit 200 according to an embodiment of the present invention. As shown in FIG. 2, the PWM circuit 200 includes a first PWM signal generator 201 and a second PWM signal generator 203. The first PWM generator 201 and the second PWM generator 203 are used to generate the first PWM signal $PWM_1$ and the second PWM signal $PWM_2$ respectively to control refresh rates in different dimensions of the output data OS generated from a target apparatus 205.

In the following, the operation of the PWM circuit 200 in FIG. 2 is detailed with reference to the diagram in FIG. 3. It should be noted that an image processing device is used as the target apparatus 205 for illustrative purposes. Therefore, the output data OS includes at least a frame, and the first PWM signal generator 201 and the second PWM signal generator 203 are used to control the brightness of the frames in different dimensions, respectively. In this case, the first PWM signal generator 201 and the second PWM signal generator 203 may be regarded as a controller for controlling the brightness of a light processing device, and the light processing device accordingly generates the output data OS with different brightness settings. However, this by no means implies that the concept of the present invention is only allowed to be applied to frames or the aforementioned light processing device. Those skilled in the art should readily understand that the concept of the present invention may be applied to other electronic devices after reading the disclosed embodiments of the present invention. These alternative designs all fall within the scope of the present invention. For example, when the concept of the present invention is not applied to a frame, the frame may be replaced by a data unit.

Figure 3:
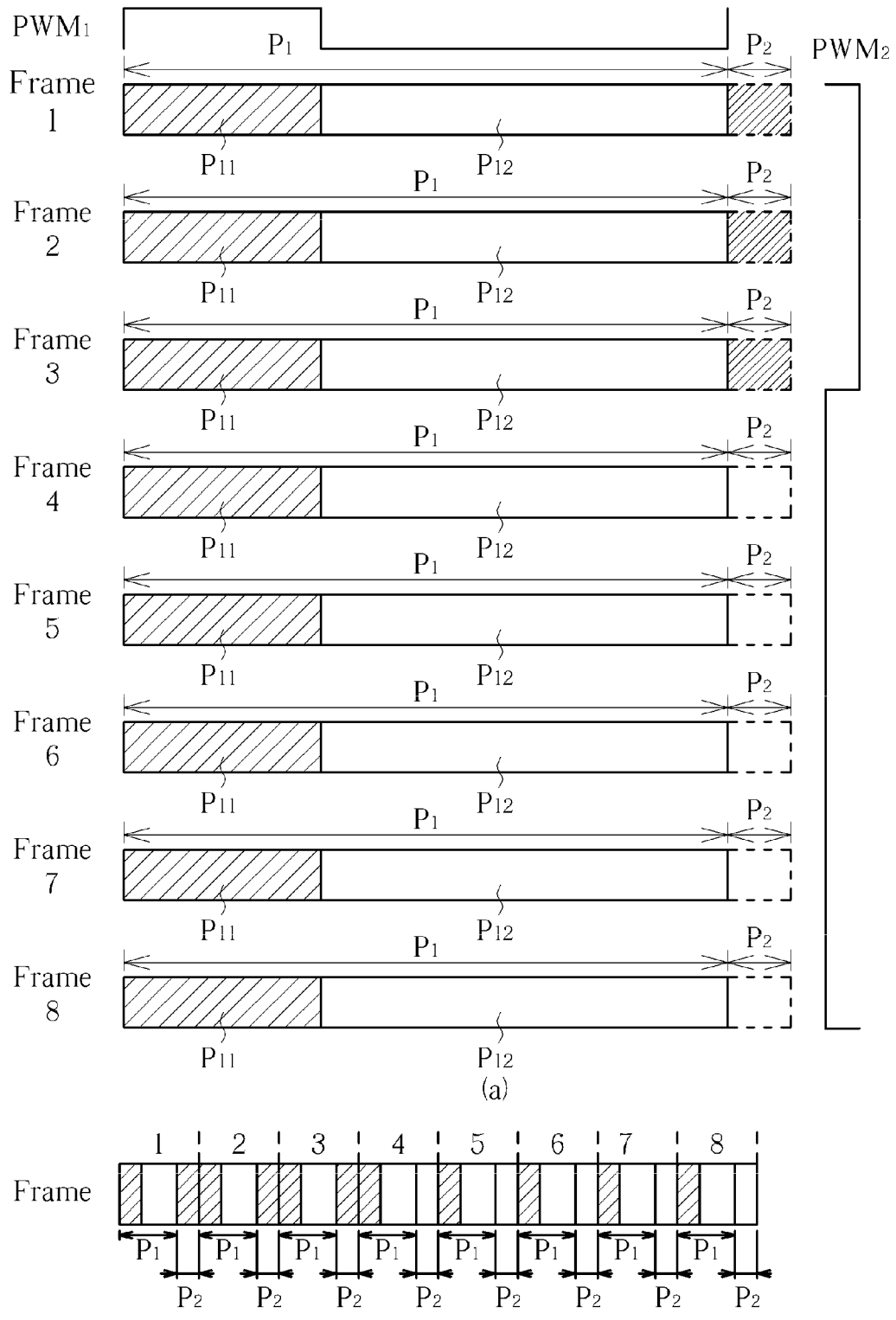
FIG. 3 is a diagram illustrating the frame operation of a PWM circuit according to an embodiment of the present invention.

Please refer to sub-diagram (a) of FIG. 3. As described above, the output data OS includes at least a frame (e.g., frame 1-frame 8 in this embodiment), where each frame could be divided into the first part $P_1$ and the second part $P_2$. In this embodiment, the first part $P_1$ and the second part $P_2$ represent different bits of the frame. The brightness of the first part $P_1$ is controlled by the first PWM signal $PWM_1$, and the brightness of the second part $P_2$ is controlled by the second PWM signal $PWM_2$. Please note that the first PWM signal $PWM_1$ and the second PWM signal $PWM_2$ control the brightness in different dimensions, respectively. As shown in the sub-diagram (a) of FIG. 3, the changing of the brightness of the first part $P_1$ is shown on the horizontal direction (the part labeled by slashes is bright), and the changing of the brightness of the first part $P_2$ is shown on the vertical direction (the part labeled by slashes is bright).

In this embodiment, the single cycle of the single first PWM signal $PWM_1$ controls at least a portion of each first part $P_1$, thus each of the first parts $P_1$ of the frame 1-frame 8 shows the same changing of the brightness. For instance, all of $P_{11}$ included the first parts $P_1$ of the frame 1-frame 8 should correspond to the high level of the first PWM signal $PWM_1$, therefore it shows the bright status. For another example, all of $P_{12}$ of the first parts $P_1$ of the frame 1-frame 8 should correspond to the low level of the first PWM signal $PWM_1$, therefore it shows the dark status. That is to say, the first parts $P_1$ of the frame 1-frame 8 would correspond to a fist cycle of the first PWM signal $PWM_1$ and show the same brightness changes.

However, the second PWM signal $PWM_2$ with a single cycle controls a plurality of second parts $P_2$. For instance, some frames, including frame 1-frame 3, correspond to the high level of the second PWM signal $PWM_2$, and the second part $P_2$ is therefore bright; and other frames, including frame 4-frame 8, correspond to the low level of the second PWM signal $PWM_2$, and the second part $P_2$ is therefore dark. That is, the changes composed of the second parts $P_2$ of the frame 1-frame 8 correspond to a second cycle of the second PWM signal $P_2$.

In the above-mentioned mechanism, the user would see frames like that presented in sub-diagram (b) of FIG. 3. Hence, the frames viewed by the user are still continuous frame 1-frame 8. However, theses continuous frames are actually controlled by two distinct PWM signals instead of only one PWM signal employed in the conventional technique. Therefore, the PWM circuit 200 is allowed to have two different refresh rates under such a mechanism, which provides more flexibility in the circuit design and breaks the trade off between resolution and refresh rate encountered in the conventional design.

Please note that the above-mentioned embodiment uses two dimensions (i.e., the vertical and the horizontal directions) to illustrate the concept of the present invention. However, the definition of the directions might be changed for different memory arrangements, different data structures, or different drawing presentation manners. Thus, the concept of the present invention should be briefly summarized as using PWM signals in two different dimensions to control the same output data to make the output data normally outputted and have two different refresh rates. Any modifications based on this concept should fall within the scope of the present invention.

Figure 4:
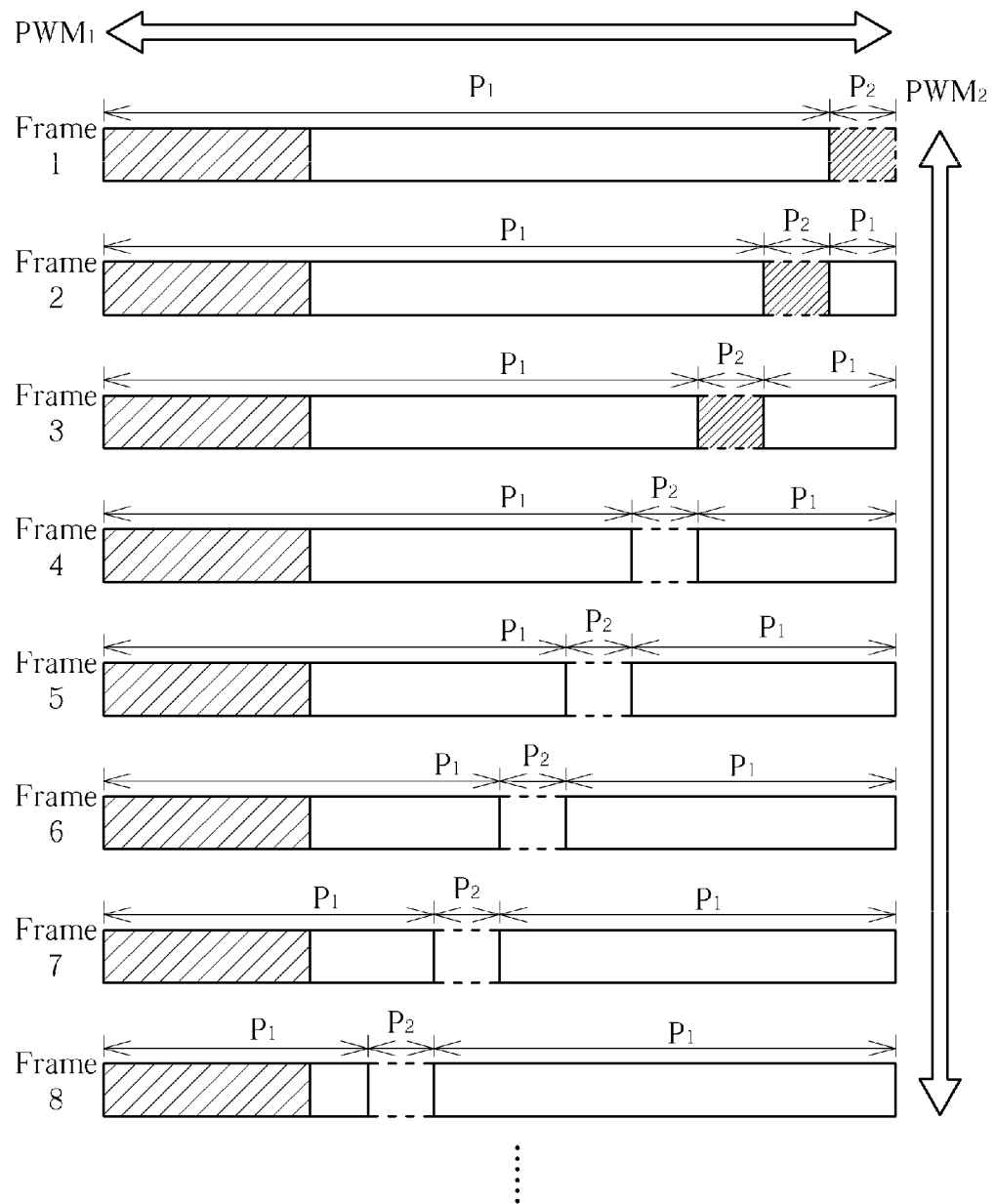
FIG. 4 is a diagram illustrating the frame operation of a PWM circuit according to an embodiment of the present invention.
Figure 5:
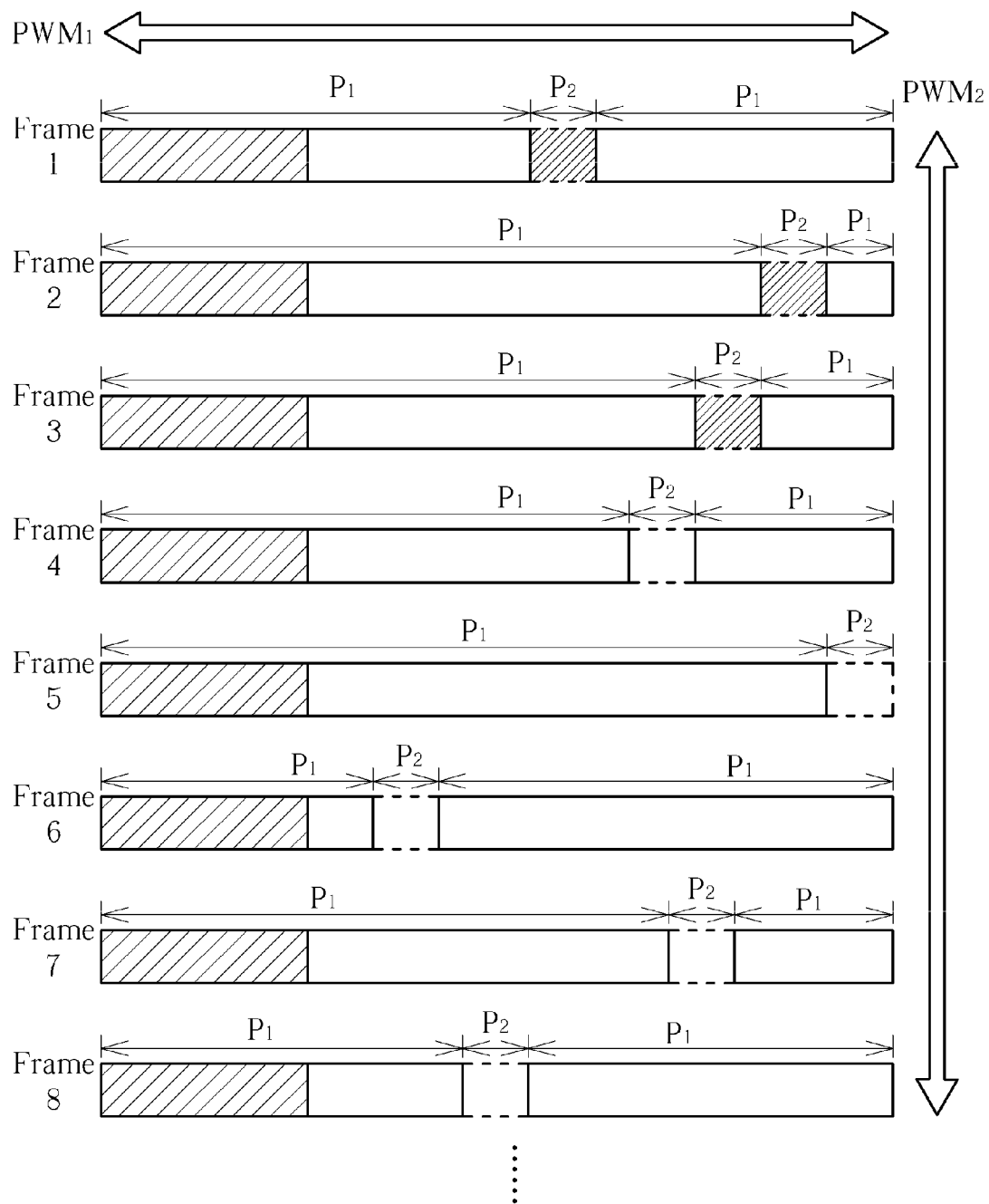
FIG. 5 is a diagram illustrating the frame operation of a PWM circuit according to an embodiment of the present invention.

Please note that the second part $P_2$ in the embodiment shown in FIG. 3 is not limited to the last few bits of each frame. Alternatively, it could be distributed in any positions co-located in all frames. Moreover, the second part $P_2$ of each frame may meet a specific rule. For example, each of the second parts $P_2$ in FIG. 4 are located at the neighboring position of the previous frame or the next frame. As these specific rules may be modified according to different design requirements, further details are omitted here for brevity. In addition, the position of the second part $P_2$ may also be decided randomly, as shown in FIG. 5. This also falls within the scope of the present invention.

Regarding the embodiments in FIG. 4 and FIG. 5, the first PWM signal $PWM_1$ and the second PWM signal $PWM_2$ may be slightly different from that used in the embodiment of FIG. 3. For example, in the embodiment of FIG. 3, the first PWM signal $PWM_1$ and the second PWM signal $PWM_2$ may operate independently without interfering with each other; however, in the embodiments of FIG. 4 and FIG. 5, the timing issue of the first PWM signal $PWM_1$ and the second PWM signal $PWM_2$ should be considered. Taking the embodiment of FIG. 4 for example, due to that the position of the second part $P_2$ of the frame 1 and the position of the second part $P_2$ of the frame 2 are different, the position of the second part $P_2$ of the frame 2 was controlled by the first PWM signal $PWM_1$ in frame 1, but would be controlled by the second PWM signal $PMW_2$ in frame 2.

Figure 6:
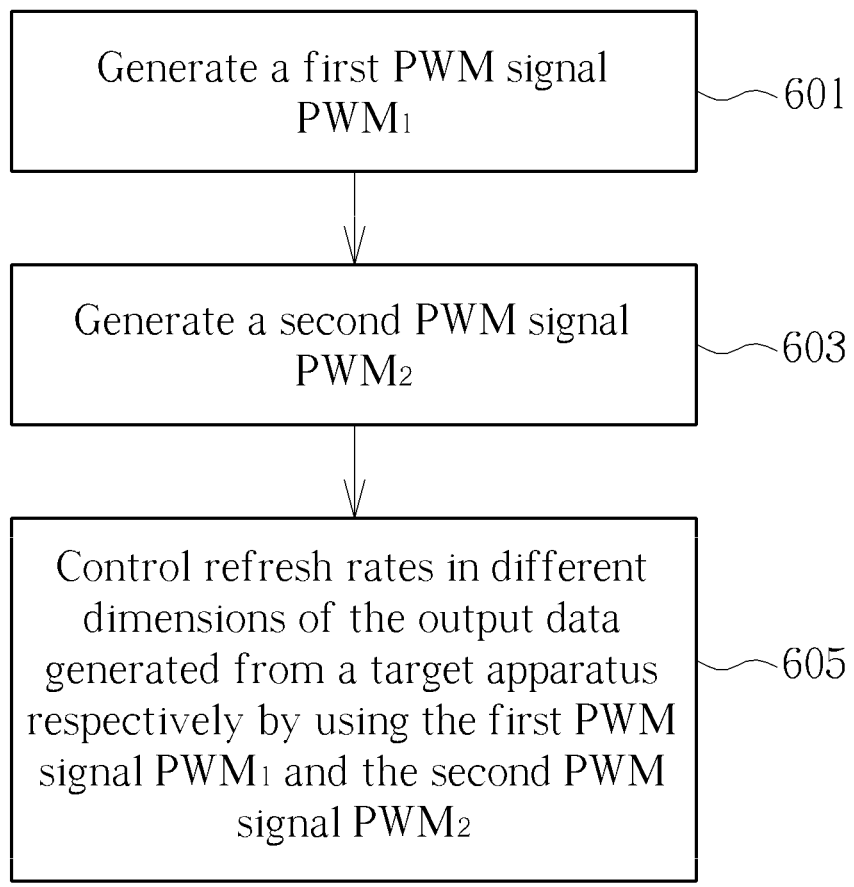
FIG. 6 is a flowchart illustrating the operation of a PWM signal generation method according to an embodiment of the present invention.

According to the above embodiments, the WPM signal generation method as shown in FIG. 6 is obtained and includes:

Step 601: Generate a first PWM signal $PWM_1$;

Step 603: Generate a second PWM signal $PWM_2$; and

Step 605: Control refresh rates in different dimensions of the output data generated from a target apparatus respectively by using the first PWM signal $PWM_1$ and the second PWM signal $PWM_2$. Taking the embodiment of FIG. 3 for example, the first PWM signal $PWM_1$ is used to control the refresh rate in the horizontal direction, while the second PWM signal $PWM_2$ is used to control the refresh rate in the vertical direction.

Figure 7:
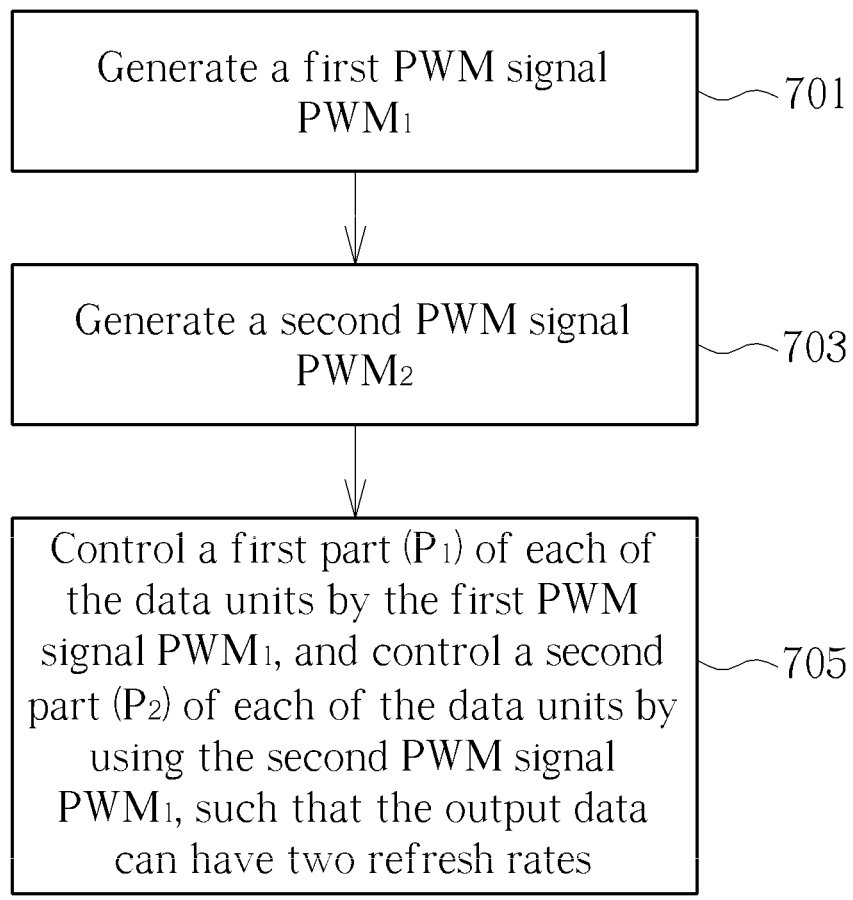
FIG. 7 is a flowchart illustrating the operation of a PWM signal generation method according to another embodiment of the present invention.

The above-mentioned exemplary WPM signal generation method may be simplified as another WPM signal generation method shown FIG. 7, which includes:

Step 701: Generate a first PWM signal $PWM_1$;

Step 703: Generate a second PWM signal $PWM_2$; and

Step 705: Control a first part ($P_1$) of each of the data units (e.g., frame 1-frame 8 of FIG. 3) by the first PWM signal $PWM_1$, and control a second part ($P_2$) of each of the data units by using the second PWM signal $PWM_1$, such that the output data can have two refresh rates.

As those skilled in this art can readily understand operations of the PWM signal generation methods of FIG. 6 and FIG. 7 after reading aforementioned embodiment of the present invention, further details are omitted here for brevity.

The above-mentioned embodiments could provide a PWM circuit and a PWM signal generation method that can have two refresh rates. With the use of the proposed mechanism, the problem of the resolution significantly limited due to the single refresh rate in the conventional design would be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pulse width modulation (PWM) circuit that can have two refresh rates, comprising:
   a first PWM signal generator; and
   a second PWM signal generator;
   wherein the first PWM signal generator and the second PWM signal generator respectively control refresh rates in different dimensions of output data from a target apparatus.

2. The PWM circuit that can have two refresh rates of claim 1, wherein the target apparatus is a light processing device, and the first PWM signal generator and the second PWM signal generator are arranged to control the brightness of the output data in the different dimensions respectively.

3. The PWM circuit of claim 1, wherein the output data comprises at plurality of frames, wherein the first PWM signal generator generates a first PWM signal for determining a first refresh rate for all the frames, and the second PWM signal generator generates a second PWM signal for determining a second refresh rate for all the frames.

4. A PWM circuit that can have two refresh rates, wherein the PWM circuit is used by a target apparatus to generate an output data, and the output data comprises a plurality of data units, and the PWM circuit comprises:
   a first PWM signal generator; and
   a second PWM signal generator;
   wherein the first PWM signal generator controls a first part of each of the data units, and the second PWM signal generator controls a second part of each of the data units, thus the output data can have two refresh rates;
   wherein a position of the second part of each of the data units is decided randomly.

5. The PWM circuit of claim 4, wherein the target device is a light processing device, and the first PWM signal generator and the second PWM signal generator are arranged to control the brightness of the data units respectively.

6. The PWM circuit of claim 4, wherein the first PWM signal generator generates a first PWM signal, and the second PWM signal generator generates a second PWM signal, and the first parts of the data units corresponding to a first cycle of the first PWM signal show the same changes, and the second parts of the data units corresponding to a second cycle of the second PWM signal show the same changes.

7. The PWM circuit of claim 4, wherein the data units are frames, wherein the first PWM signal generator generates a first PWM signal for determining a first refresh rate for all the frames, and the second PWM signal generator generates a second PWM signal for determining a second refresh rate for all the frames.

8. A PWM signal generation method that can have two refresh rates, comprising:
   generating a first PWM signal;
   generating a second PWM signal; and
   controlling refresh rates in different dimensions of output data from a target apparatus respectively by using the first PWM signal and the second PWM signal.

9. The PWM signal generation method that can have two refresh rates of claim 8, wherein the target apparatus is a light processing device, and the first PWM signal and the second PWM signal are arranged to control the brightness of the output data in the different dimensions respectively.

10. The PWM signal generation method of claim 8, wherein the output data comprises a plurality of frames, wherein the first PWM signal generator generates a first PWM signal for determining a first refresh rate for all the frames, and the second PWM signal generator generates a second PWM signal for determining a second refresh rate for all the frames.

11. A PWM signal generation method that can have two refresh rates, wherein the PWM signal generation method is used by a target apparatus to generate an output data, and the output data comprises a plurality of data units, and the PWM signal generation method comprises:
   generating a first PWM signal;
   generating a second PWM signal; and
   controlling a first part of each of the data units by the first PWM signal, and controlling a second part of each of the data units by using the second PWM signal, thus the output data can have two refresh rates;
   wherein a position of the second part of each of the data units is decided randomly.

12. The PWM signal generation method of claim 11, wherein the target device is a light processing device, and the first PWM signal generator and the second PWM signal generator are arranged to control the brightness of the data units respectively.

13. The PWM signal generation method of claim 11, wherein the first PWM signal generator generates a first PWM signal, and the second PWM signal generator generates a second PWM signal, and the first parts of the data units corresponding to a first cycle of the first PWM signal show the same changes, and the second parts of the data units corresponding to a second cycle of the second PWM signal show the same changes.

14. The PWM signal generation method of claim 11, wherein the data units are frames, wherein the first PWM signal generator generates a first PWM signal for determining a first refresh rate for all the frames, and the second PWM signal generator generates a second PWM signal for determining a second refresh rate for all the frames.

15. A PWM circuit that can have two refresh rates, wherein the PWM circuit is used by a target apparatus to generate an output data, and the output data comprises a plurality of data units, and the PWM circuit comprises:
   a first PWM signal generator; and
   a second PWM signal generator;
   wherein the first PWM signal generator controls a first part of each of the data units, and the second PWM signal generator controls a second part of each of the data units, thus the output data can have two refresh rates;
   wherein the data units are frames, wherein the first PWM signal generator generates a first PWM signal for determining a first refresh rate for all the frames, and the second PWM signal generator generates a second PWM signal for determining a second refresh rate for all the frames.

16. A PWM signal generation method that can have two refresh rates, wherein the PWM signal generation method is used by a target apparatus to generate an output data, and the output data comprises a plurality of data units, and the PWM signal generation method comprises:
generating a first PWM signal;
generating a second PWM signal; and
controlling a first part of each of the data units by the first PWM signal, and controlling a second part of each of the data units by using the second PWM signal, thus the output data can have two refresh rates;
wherein the data units are frames, wherein the first PWM signal generator generates a first PWM signal for determining a first refresh rate for all the frames, and the second PWM signal generator generates a second PWM signal for determining a second refresh rate for all the frames.

* * * * *